United States Patent
Lotz et al.

(10) Patent No.: US 7,215,581 B2
(45) Date of Patent: *May 8, 2007

(54) TRIPLE REDUNDANT LATCH DESIGN WITH LOW DELAY TIME

(75) Inventors: Jonathan P Lotz, Fort Collins, CO (US); Daniel W. Krueger, Fort Collins, CO (US); Manuel Cabanas-Holmen, Longmont, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 516 days.

This patent is subject to a terminal disclaimer.

(21) Appl. No.: 10/825,398

(22) Filed: Apr. 14, 2004

(65) Prior Publication Data

US 2005/0251729 A1    Nov. 10, 2005

(51) Int. Cl.
*G11C 7/10* (2006.01)
*G11C 11/00* (2006.01)
*G11C 29/00* (2006.01)
*H03K 3/02* (2006.01)
*H03K 3/12* (2006.01)

(52) U.S. Cl. .......... 365/189.05; 326/10; 327/197; 327/199; 365/154; 365/200; 714/797

(58) Field of Classification Search ............ None
See application file for complete search history.

(56) References Cited

U.S. PATENT DOCUMENTS

| | | | |
|---|---|---|---|
| 6,504,411 B2* | 1/2003 | Cartagena | 327/199 |
| 6,882,201 B1* | 4/2005 | Koch et al. | 327/199 |
| 6,937,527 B1* | 8/2005 | Lotz et al. | 365/189.05 |
| 7,027,333 B2* | 4/2006 | Petersen et al. | 365/189.05 |
| 7,054,203 B2* | 5/2006 | Lotz et al. | 365/189.05 |
| 7,095,262 B2* | 8/2006 | Petersen et al. | 327/197 |
| 2002/0095641 A1* | 7/2002 | Cartagena | 714/797 |
| 2005/0251729 A1* | 11/2005 | Lotz et al. | 714/797 |
| 2005/0265089 A1* | 12/2005 | Lotz et al. | 365/200 |
| 2006/0012413 A1* | 1/2006 | Petersen et al. | 327/199 |
| 2006/0050550 A1* | 3/2006 | Petersen et al. | 365/154 |
| 2006/0227596 A1* | 10/2006 | Thayer | 365/154 |
| 2006/0236158 A1* | 10/2006 | Thayer | 714/701 |

* cited by examiner

*Primary Examiner*—Rexford Barnie
*Assistant Examiner*—Dylan White

(57) ABSTRACT

In a preferred embodiment, the invention provides a circuit and method for a smaller and faster triple redundant latch. Three settable memory elements set an identical logical value into each settable memory element. After the settable memory elements are set, a voting structure with inputs from the first settable memory element, the second memory element, and control to the settable memory elements determines the logical value held on the third settable memory element. The propagation delay through the third settable memory element is the only propagation delay of the triple redundant latch.

30 Claims, 4 Drawing Sheets

TRIPLE REDUNDANT LATCH DESIGN WITH LOW DELAY TIME

FIELD OF THE INVENTION

This invention relates generally to latch design. More particularly, this invention relates to improving soft error immunity in latches.

BACKGROUND OF THE INVENTION

High-energy neutrons lose energy in materials mainly through collisions with silicon nuclei that lead to a chain of secondary reactions. These reactions deposit a dense track of electron-hole pairs as they pass through a p-n junction. Some of the deposited charge will recombine, and some will be collected at the junction contacts. When a particle strikes a sensitive region of a latch, the charge that accumulates could exceed the minimum charge that is needed to "flip" the value stored on the latch, resulting in a soft error.

The smallest charge that results in a soft error is called the critical charge of the latch. The rate at which soft errors occur (SER) is typically expressed in terms of failures in time (FIT).

A common source of soft errors are alpha particles which may be emitted by trace amounts of radioactive isotopes present in packing materials of integrated circuits. "Bump" material used in flip-chip packaging techniques has also been identified as a possible source of alpha particles.

Other sources of soft errors include high-energy cosmic rays and solar particles. High-energy cosmic rays and solar particles react with the upper atmosphere generating high-energy protons and neutrons that shower to the earth. Neutrons can be particularly troublesome as they can penetrate most man-made construction (a neutron can easily pass through five feet of concrete). This effect varies with both latitude and altitude. In London, the effect is two times worse than on the equator. In Denver, Colo. with its mile-high altitude, the effect is three times worse than at sea-level San Francisco. In a commercial airplane, the effect can be 100–800 times worse than at sea-level.

Radiation induced soft errors are becoming one of the main contributors to failure rates in microprocessors and other complex ICs (integrated circuits). Several approaches have been suggested to reduce this type of failure. Adding ECC (Error Correction Code) or parity in data paths approaches this problem from an architectural level. Adding ECC or parity in data paths can be complex and costly.

At the circuit level, SER may be reduced by increasing the ratio of capacitance created by oxides to the capacitance created by p/n junctions. The capacitance in a latch, among other types, includes capacitance created by p/n junctions and capacitance created by oxides. Since electron/holes pairs are created as high-energy neutrons pass through a p/n junction, a reduction in the area of p/n junctions in a latch typically decreases the SER. Significant numbers of electron/hole pairs are not created when high-energy neutrons pass through oxides. As a result, the SER may typically be reduced by increasing the ratio of oxide capacitance to p/n junction capacitance in a SRAM cell.

There is a need in the art to reduce the SER in latches. An embodiment of this invention reduces the SER in latches while adding only a small increase in physical size of the latch and a small increase in the delay time through the latch.

SUMMARY OF THE INVENTION

In a preferred embodiment, the invention provides a circuit and method for a smaller and faster triple redundant latch. Three settable memory elements set an identical logical value into each settable memory element. After the settable memory elements are set, a voting structure with inputs from the first settable memory element, the second memory element, and control to the settable memory elements determines the logical value held on the third settable memory element. The propagation delay through the third settable memory element is the only propagation delay of the triple redundant latch.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
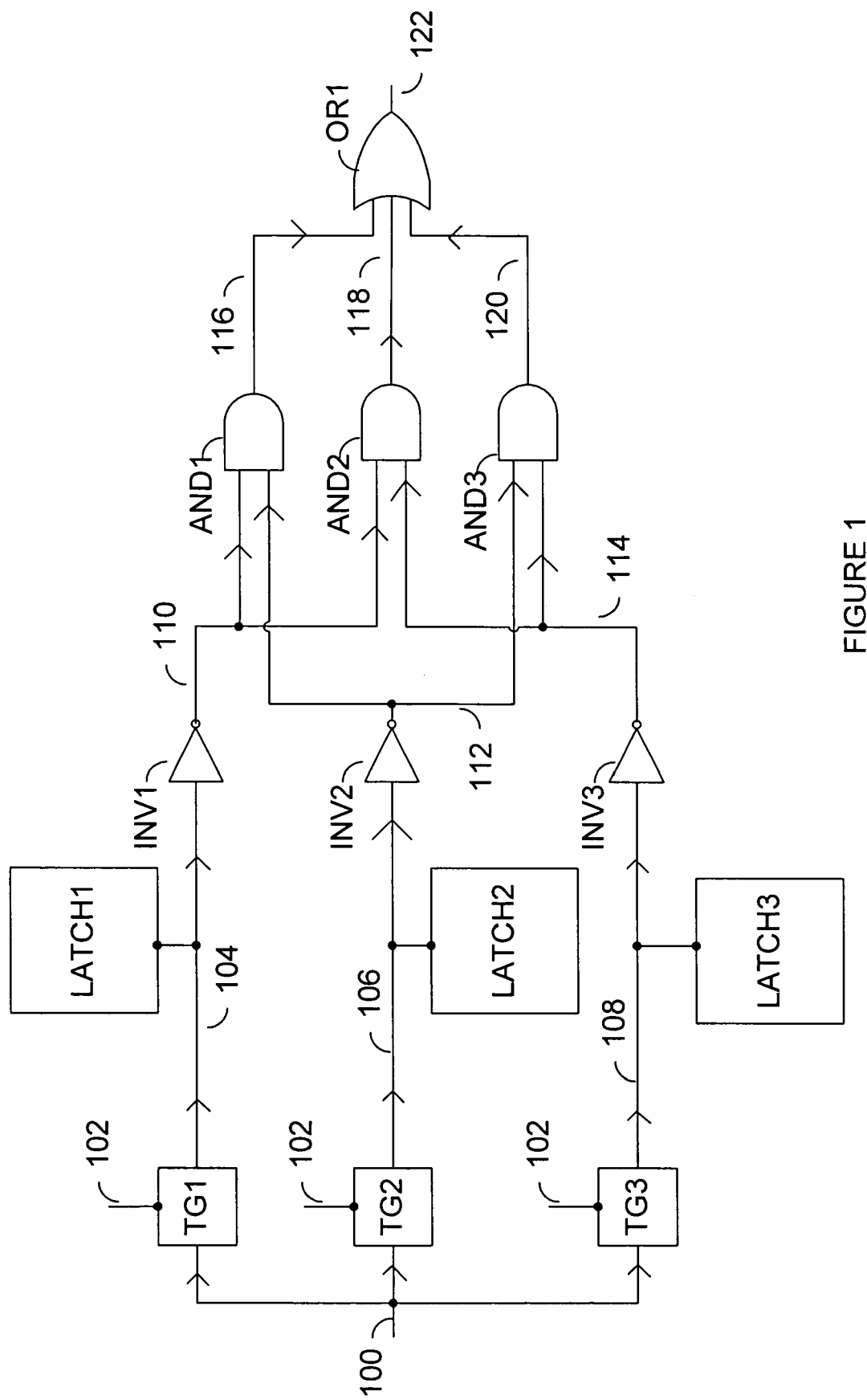
FIG. 1 is a schematic of a triple redundant latch. Prior Art

FIG. 1 is a schematic of a triple redundant latch. The input, 100, to the triple redundant latch is connected to the input of transfer gates, TG1, TG2, and TG3. Control signal, 102, is connected to transfer gates, TG1, TG2, and TG3. Control signal, 102, controls when the signal on the input of transfer gates, TG1, TG2, and TG3 is transferred to the outputs, 104, 106, and 108 of transfer gates, TG1, TG2, and TG3 respectively. The signal presented to outputs, 104, 106, and 108, is stored in LATCH1, LATCH2, and LATCH3 respectively.

After control signal, 102, is turned off, the signal on LATCH1 drives the input of inverter, INV1. After control signal, 102, is turned off, the signal on LATCH2 drives the input of inverter, INV2. After control signal, 102, is turned off, the signal on LATCH3 drives the input of inverter, INV3. The output, 110, of inverter, INV1, drives an input to AND1 and an input to AND2. The output, 112, of inverter, INV2, drives an input to AND1 and an input to AND3. The output, 114, of inverter, INV3, drives an input to AND2 and an input to AND3. The output, 116, of AND1 drives an input of OR1. The output, 118, of AND2 drives an input of OR1. The output, 120, of AND3 drives an input of OR1. The output of the triple redundant latch is the output, 122 of OR1.

A triple redundant latch reduces soft errors by storing the same data in three different latches. For example, when the control signal, 102 is on, a logical high value may be driven from the inputs, 100, of transfer gates, TG1, TG2, and TG3 to the outputs, 104, 106, and 108, of transfer gates, TG1, TG2, and TG3 respectively. After turning control signal 102 off, a logical high value is stored in latches, LATCH1, LATCH2, and LATCH3. The stored logical high value on LATCH1 drives the input of inverter, INV1, and produces a logical low value on the output, 110, of inverter, INV1. The stored logical high value on LATCH2 drives the input of inverter, INV2, and produces a logical low value on the output, 112, of inverter, INV2. The stored logical high value on LATCH3 drives the input of inverter, INV3, and produces a logical low value on the output, 114, of inverter, INV3.

Since the output, 110, 112, and 114 of inverters, INV1, INV2, and INV3, respectively, are low, all the inputs, 110, 112, and 114 to AND1, AND2, and AND3 respectively are a logical low value. Since all the inputs, 110, 112, and 114, to AND1, AND2, and AND3 respectively are a logical low value, the output, 116, 118, and 120 of AND1, AND2, and AND3 respectively are a logical low value. Since the output, 116, 118, and 120 of AND1, AND2, and AND3, respectively are a logical low value, all the inputs of OR1 are a logical low value. Since all the inputs, 116, 118, and 120 to OR1 are logical low value, the output, 122, is logical low value.

If a soft error occurs, for example, in LATCH2, and changes the stored logical value from a logical high value to a logical low value, a logical low value is now presented to the input, 106, of inverter, INV2. The output, 112, of inverter, INV2, presents a logical high value to an input of AND1 and AND3. Since, in this example, the other input, 110 to AND1 and the other input, 114, to AND3, is a logical low value, the output, 116 and 120 of AND1 and AND3 respectively remains a logical low value and the output, 122, does not change. This example illustrates how a single soft error in one latch does not change the original stored value in a triple redundant latch.

As a further example, assume, in addition to the soft error in LATCH2, there is an additional soft error in LATCH3. Now, the input, 108, to inverter, INV3, is a logical low value and as a result, the output, 114, of inverter, INV3, is a logical high value. A logical high value in now presented to an input, 114, of AND2, and to an input, 114, of AND3. Since a logical low and logical high value are presented on the inputs of AND1, the output, 116 of AND1 is still a logical low value. Since a logical low and logical high value are presented on the inputs of AND2, the output, 118 of AND2 is still a logical low value. However, since inputs, 112 and 114, to AND3 are a logical high value, the output, 120, is a logical high value. Since input, 120, to OR1 is a logical high value, the output, 122, changes from a logical low value to a logical high value. This example illustrates how soft errors in two latches of a triple redundant latch do change the original stored value of the triple redundant latch.

A triple redundant latch prevents a single soft error from changing the original value stored in the latch. However, this comes at the cost of additional circuitry which results in a physically larger latch. In addition, a triple redundant may introduce time delay in the delay path of the latch. As consequence, a triple redundant latch is usually larger and slower than a single latch.

Figure 2:
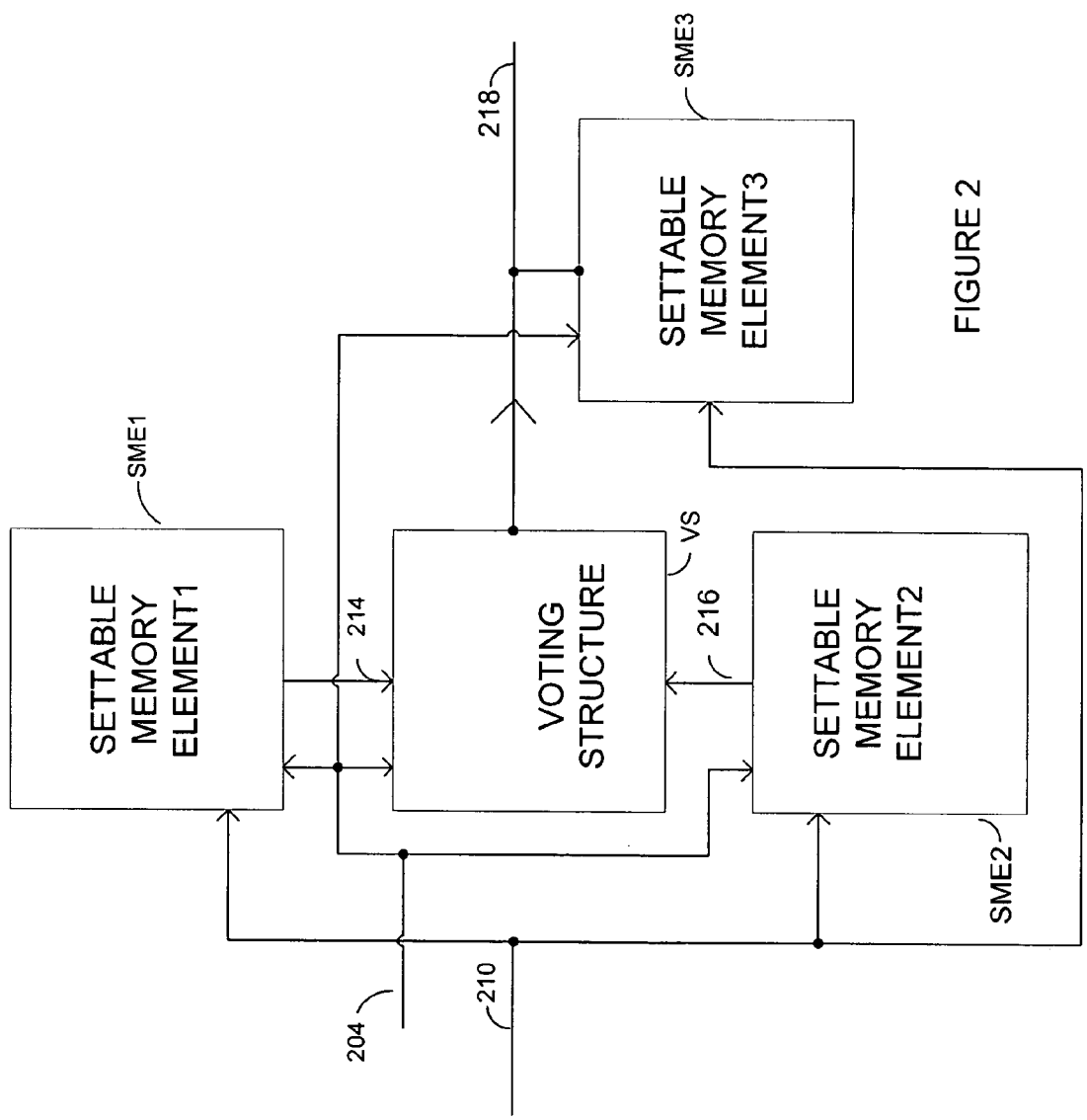
FIG. 2 is a block diagram of an embodiment of an improved triple redundant latch.

FIG. 2 is a block diagram of an embodiment of an improved triple redundant latch. In this embodiment, an identical logical value, 210, is set into settable memory element1, SME1, settable memory element2, SME2, and settable memory element3, SME3, by controlling signal 204. After an identical logical value, 210, is set into settable memory element1, SME1, settable memory element2, SME2, and settable memory element3, SME3, by controlling signal 204, the identical logical value is held in all three settable memory elements, SME1, SME2, and SME3. The voting structure, VS, after an identical logical value, 210, is set into settable memory element1, SME1, settable memory element2, SME2, and settable memory element3, SME3, determines the logical value, 218, stored in settable memory element three, SME3, based on the logical values presented to input, 214, input, 216, and control signal, 204.

If the logical value, 218, stored in settable memory element three, SME3, is disturbed by a soft error event, the voting structure, VS, will restore the original logical value stored in settable memory element three, SME3. If the logical value stored in settable memory element one, SME1, is disturbed by a soft error event, the voting structure, VS, will tri-state its output, 218, leaving the original logical value stored in settable memory element three, SME3. If the logical value stored in settable memory element two, SME2, is disturbed by a soft error event, the voting structure, VS, will tri-state its output, 218, leaving the original logical value stored in settable memory element three, SME3. If any two settable memory elements are disturbed by a soft error event, the logical value original stored in the triple redundant latch may fail.

The delay time through the triple redundant latch shown in FIG. 2 is determined by a small amount of capacitance added by the voting structure, VS, and the propagation delay of the settable memory element3, SME3. This embodiment of the invention significantly improves the delay time of a triple redundant latch. The delay time through the prior art shown in FIG. 1, for example, includes the propagation delay through the slowest latch among latches LATCH1, LATCH2, and LATCH3, the propagation delay through an inverter, INV2, the propagation delay through an AND gate, AND2, and the propagation delay through an OR gate, OR1.

Figure 3:
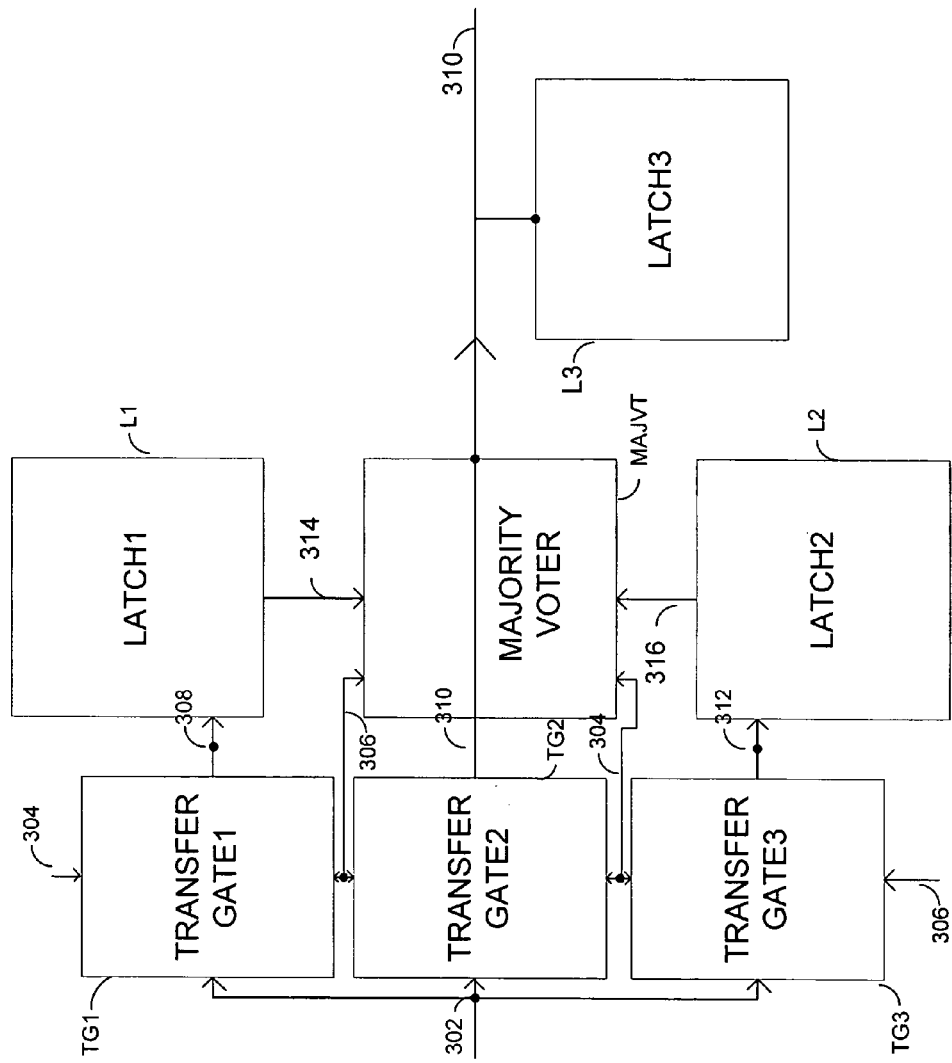
FIG. 3 is a block diagram of an improved triple redundant latch.

FIG. 3 is a block diagram of a triple redundant latch with improved delay and size. The input of the triple redundant latch shown in this example is connected to the inputs, 302, of transfer gates, TG1, TG2, and TG3. In addition, a tristatable input inverter, a cross-coupled NAND gate, and a cross-coupled NOR gate may used in place of a transfer gate. If the control signals, 304 and 306, are on, the signal at the input, 302, of transfer gates, TG1, TG2, and TG3, is transferred to the output, 308, of transfer gate, TG1, the output, 310, of transfer gate, TG2, and the output, 312 of transfer gate, TG3. The logical value presented on the output, 308, of transfer gate TG1, is also an input to latch1, L1. The logical value presented on the output, 312, of transfer gate TG3, is also an input to latch2, L2. The logical value presented on the output, 310, of transfer gate TG2, is also connected to the output, 310, of the majority voter, MAJVT, and the input/output, 310, of latch3, L3.

The output, 314, of latch1, L1, is connected to an input, 314, of the majority voter, MAJVT. The output, 316, of latch2, L2, is connected to an input, 316, of the majority voter, MAJVT. Control signals, 304, and 306, are also connected to inputs of the majority voter, MAJVT.

As an example of how redundancy applies for this embodiment, assume that a logical high value is stored. Storage nodes 308, 310, and 312 each have a logical high value stored in this example. The output, 314, of latch1, L1, provides a logical low value to an input of the majority voter, MAJVT. The output, 316, of latch1, L2, provides a logical low value to an input of the majority voter, MAJVT. The control signals, 304 and 306, provide a logical low value and a logical high value respectively to two inputs of the majority voter, MAJVT. As a result of the logical values presented to the majority voter, MAJVT, the output, 310, of the majority voter, MAJVT, is driven high to match the logical high value stored on latch3, L3.

If, in this example, a soft error event changes the logical value stored on latch1, L1, from a logical high value to a logical low value, the logical value stored on latch3, L3, will retain its logical high value because the output, 310, of the majority voter, MAJVT, is tri-stated. As a result, the triple redundant latch retains the original logical value stored on it despite a single soft error.

If in this example a soft error event changes the logical value stored on latch1, L2, from a logical high value to a logical low, the logical value stored on latch3, L3, will retain its logical high value because the output, 310, of the majority voter, MAJVT, is tri-stated. As a result, the triple redundant latch retains the original logical value stored on it despite a single soft error.

If in this example a soft error event changes the logical value stored on latch1, L3, from a logical high value to a logical low, the majority voter, MAJVT, will drive input/out, 310, of latch3, L3, back to a logical high value. As a result, the triple redundant latch retains the original logical value stored on it despite a single soft error.

If, however, in this example, a soft error event changes the values stored on nodes 308 and 312, the triple redundant latch will change from its original value. If a soft error event changes the logical values stored on nodes 308 and 312, from logical high values to a logical low values, the inputs, 314 and 316, to the majority voter, MAJVT, change from logical low values to logical high values. As a result of having logical high values on the inputs, 314 and 316, the majority vote is a logical low value. As a result, the logical value stored on node 310 is changed from the original logical high value to a logical low value. In this example, the original value stored in the triple redundant latch is changed from a logical high value to a logical low value.

In addition to improving the soft error rate of a latch, the triple redundant latch shown in FIG. 3, also reduces the physical size of a triple redundant latch because it uses fewer transistors. The triple redundant latch shown in FIG. 3 also reduces the delay time through a triple redundant latch because the number of logic delays is reduced.

Figure 4:
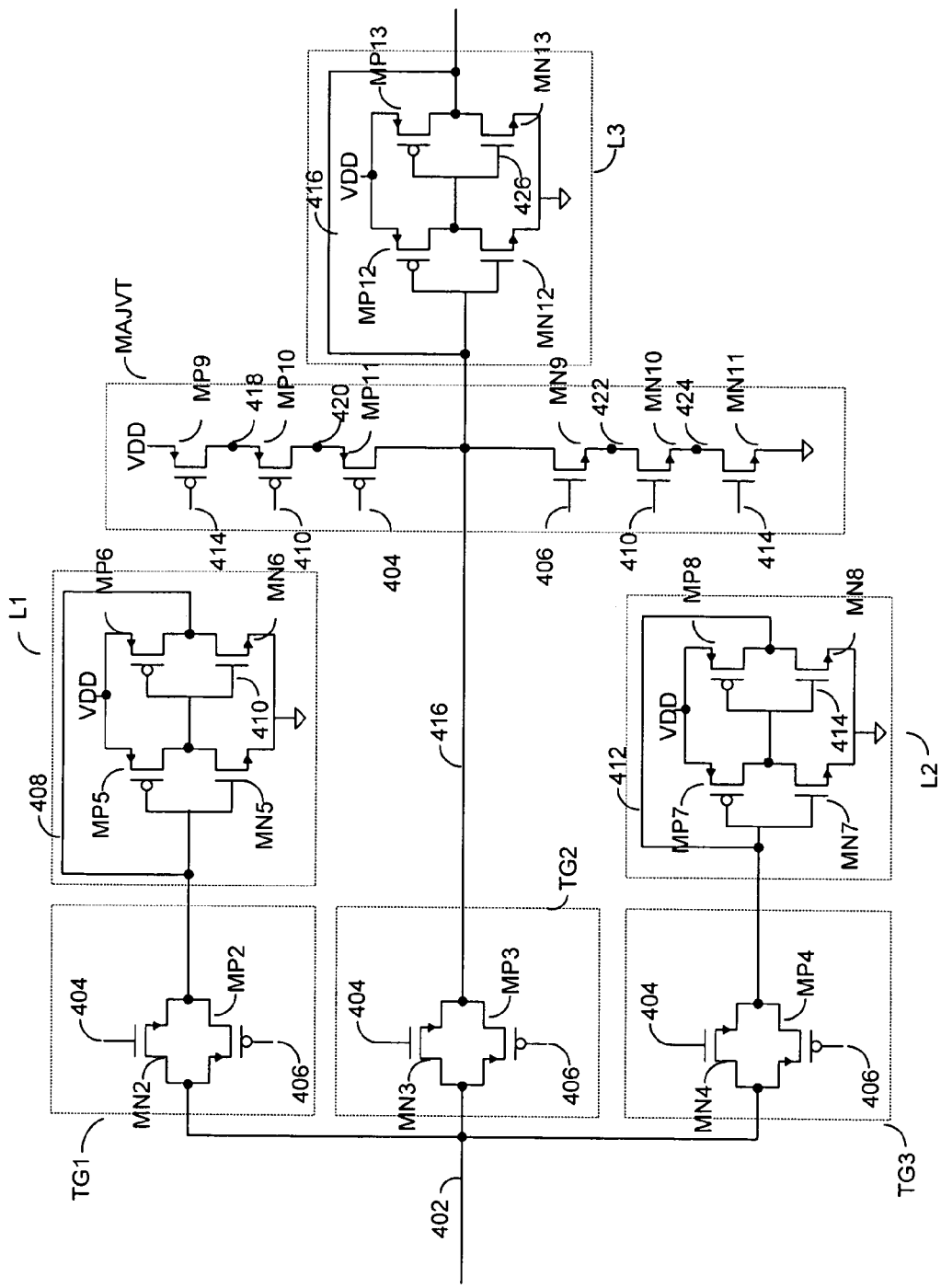
FIG. 4 is a schematic of an improved triple redundant latch.

FIG. 4 is a schematic of an improved triple redundant latch. FIG. 4 contains the same basic blocks that FIG. 3 contains; transfer gate 1, TG1, transfer gate 2, TG2, transfer gate 3, TG3, latch1, L1, latch2, L2, latch3, L3, and majority voter, MAJVT.

An embodiment of a transfer gate 1, TG1, for the triple redundant latch contains a PFET, MP2 and an NFET MN2. In this embodiment, the drains of PFET, MP2, and NFET, MN2, are connected to the input, 402, of transfer gate 1, TG1. The sources of PFET, MP2, and NFET, MN2, are connected to the output, 408, of transfer gate 1, TG1. The gate of PFET, MP2, is connected to the control input, 406, of transfer gate 1, TG1. The gate of NFET, MN2, is connected to the control input, 404, of transfer gate 1, TG1.

An embodiment of a transfer gate 2, TG2, for the triple redundant latch contains a PFET, MP3 and an NFET MN3. In this embodiment, the drains of PFET, MP3, and NFET, MN3, are connected to the input, 402, of transfer gate 2, TG2. The sources of PFET, MP3, and NFET, MN3, are connected to the output, 416, of transfer gate 2, TG2. The gate of PFET, MP3, is connected to the control input, 406, of transfer gate 2, TG2. The gate of NFET, MN3, is connected to the control input, 404, of transfer gate 2, TG2.

An embodiment of a transfer gate 3, TG3, for the triple redundant latch contains a PFET, MP4 and an NFET MN4. In this embodiment, the drains of PFET, MP4, and NFET, MN4, are connected to the input, 402, of transfer gate 3, TG3. The sources of PFET, MP4, and NFET, MN4, are connected to the output, 412, of transfer gate 3, TG3. The gate of PFET, MP4, is connected to the control input, 406, of transfer gate 3, TG3. The gate of NFET, MN4, is connected to the control input, 404, of transfer gate 3, TG3.

An embodiment of latch1, L1, for the triple redundant latch contains PFET, MP5, NFET, MN5, PFET, MP6, and NFET, MN6. In this embodiment, the gate of PFET, MP5, and the gate of NFET, MN5, is connected to the drain of PFET, MP6 and to the drain of NFET, MN6, the input, 408, of latch1, L1. The drain of PFET, MP5, and the drain of NFET, MN5, is connected to the gate of PFET, MP6 and to the gate of NFET, MN6, the output, 410, of latch1, L1. The sources of PFET, MP5 and PFET, MP6 are connected to VDD. The sources of NFET, MN5, and NFET, MN6 are connected to GND.

An embodiment of latch2, L2, for the triple redundant latch contains PFET, MP7, NFET, MN7, PFET, MP8, and NFET, MN8. In this embodiment, the gate of PFET, MP7, and the gate of NFET, MN7, is connected to the drain of PFET, MP8 and to the drain of NFET, MN8, the input, 412, of latch2, L2. The drain of PFET, MP7, and the drain of NFET, MN7, is connected to the gate of PFET, MP8 and to the gate of NFET, MN8, the output, 414, of latch2, L2. The sources of PFET, MP7 and PFET, MP8 are connected to VDD. The sources of NFET, MN7, and NFET, MN8 are connected to GND.

An embodiment of latch3, L3, for the triple redundant latch contains PFET, MP12, NFET, MN12, PFET, MP13, and NFET, MN13. In this embodiment, the gate of PFET, MP12, and the gate of NFET, MN12, is connected to the drain of PFET, MP13 and to the drain of NFET, MN13, the input/output, 416, of latch3, L3. The drain of PFET, MP12, and the drain of NFET, MN12, is connected to the gate of PFET, MP13 and to the gate of NFET, MN13, node 426, of latch3, L3. The sources of PFET, MP12 and PFET, MP13 are connected to VDD. The sources of NFET, MN12, and NFET, MN13 are connected to GND.

An embodiment of a majority voter, MAJVT, for the triple redundant latch contains PFET, MP9, PFET, MP10, PFET, MP11, NFET, MN9, NFET, MN10, and NFET, MN11. In this embodiment, the gates of PFET, MP10, and NFET, MN10, are connected to the first input, 410, of the majority voter, MAJVT. The gates of PFET, MN9, and NFET, MNI1, are connected to the second input, 414, of the majority voter, MAJVT. The gate of PFET, MP11, is connected to the third input, 404, of the majority voter, MAJVT. The gate of NFET, MN9, is connected to the fourth input, 406, of the majority voter, MAJVT. The source of PFET, MP9, is connected to VDD. The source of NFET, MN11, is connected to GND. The drain, 418, of PFET, MP9, is connected to the source of PFET, MP10, 418. The drain, 420, of PFET, MP10, is connected to the source of PFET, MP11, 420. The drain of PFET, MP1 and the drain of NFET, MN9 are connected to the output, 416, of the majority voter, MAJVT. The source, 422, of NFET, MP9, is connected to the drain of NFET, MN10, 422. The source, 424, of NFET, MN10, is connected to the drain of NFET, MN11, 424.

FIG. 4 is a schematic of an improved triple redundant latch. An input signal drives the inputs, 402, of transfer gate 1, TG1, transfer gate 2, TG2, and transfer gate 3, TG3. If control signal, 404 is a logical high value and control signal, 406, is a logical low value, the signal at the input, 402, of transfer gate 1, TG1, transfer gate 2, TG2, and transfer gate 3, TG3 is transferred to the output, 408, of transfer gate 1, TG1, the output, 416, of transfer gate 2, TG2, and the output, 412, of transfer gate 3, TG3.

The signal transferred to nodes 408, 416, and 412 is also presented to the input, 408, of latch1, L1, the input, 412, of latch2, L2, the input/output, 416, of latch3, L3, and the output, 416 of the majority voter, MAJVT. Latches L1, L2, and L3 store the same signal. The outputs, 410 and 414, of latches, L1 and L2 respectively, output the opposite sense of the signal stored. The outputs, 410 and 414, of latches, L1 and L2 respectively, along with the first, 404, and second, 406, control signals are inputs to the majority voter, MAJVT. The inputs, 404, 406, 410, and 414, into the majority voter, MAJVT, cause the majority voter, MAJVT, to reinforce the signal presented at the output, 416, of transfer gate 2, TG2.

After control input, 404, is driven to a logical low value, and control input, 406, is driven to a logical high value, latch1, L1, latch2, L2, and latch3, L3 store the original logical value presented on nodes 408, 412, and 416, respectively. If none of the nodes, 408, 412, and 416, is disturbed, then a signal of the same sense is presented on the output, 416, of the majority voter, MAJVT.

For example, if a logical high value is stored on nodes 408, 412, and 416, then a logical high value is presented on the output, 416, of the majority voter, MAJVT. A logical low value on the output, 410, of latch1, L1, is applied to the first input of the majority voter, MAJVT. A logical low value on the output, 414, of latch2, L2, is applied to the second input of the majority voter, MAJVT. Since in this example, the transfer gates are turned off, control signal 404, is low and control signal 406, is high. Because control signal 404 is low, a logical low value is applied to the third input of the majority voter, MAJVT. Because control signal 406 is high, a logical high value is applied to the fourth input of the majority voter, MAJVT. With these logical values applied to the majority voter, MAJVT, the output, 416, of majority voter, MAJVT, remains a high logical value.

If in this example where a logical high value is stored on nodes, 408, 412, and 416, node 408 is changed to a logical low value by a soft error event, a logical high value is then presented to input, 410, of the majority voter, MAJVT. Inputs, 414, and 404, remain a logical low value while input 406 remains a logical high value. Since input, 410, has changed from a low logical value to a high logical value, node 416, is no longer actively driven high by the majority voter, MAJVT. However, since latch3, L3 has not been disturbed, latch3, L3, actively holds node 416 at a logical high value. As a consequence, despite latch1, L1, being disturbed by a soft error event to a logical low value, the value on the output, 428, of the triple redundant latch remains a logical high value.

If, however, a soft error event changes the value stored on node, 408 and node, 412, the triple redundant latch will change from its original value. For example, if a logical high value is stored on nodes 408, 412, and 416, a logical high value is presented on the output, 416, of the majority voter, MAJVT. If a soft error event changes the logical value stored on nodes, 408 and 412, from a logical high value to a logical low value, inputs, 410 and 414, into the majority voter, MAJVT, change from logical low values to logical high values. Since inputs, 410 and 414, of the majority voter, MAJVT, are a logical high value, and control signal, 406, remains a logical high value, the majority voter output, 416, is pulled to a logical low value. The high logical value stored on latch3, L3, is then flipped to a logical low value. The output, 428, of the triple redundant latch, is then changed from a logical low value to a logical high value.

If a single soft error event temporally changes the logical value stored in latch3, L3, the majority voter, MAJVT, will reset the logical value on latch3, L3, to its original value. The logical state on latch3, L3, is reset to its original value because none of the inputs, 404, 406, 310, and 414, on the majority voter, MAJVT, has changed as a consequence of latch3, L3, changing its logical value. Therefore, the output, 416, of the majority voter, MAJVT, drives latch3, L3, back to its original value.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A triple redundant latch for reducing soft errors comprising:
    a) a first settable memory element;
    b) a second settable memory element;
    c) a third settable memory element;
    d) a voting structure;
    e) wherein an identical logic value is set in each settable memory element;
    f) wherein the voting structure determines a logical value held on the third settable memory element after the first, second, and third settable memory elements are set;
    g) wherein inputs to the voting structure are provided by the first settable memory element, the second settable memory element, and control signals used to set the settable memory elements;
    h) wherein a propagation delay through the third settable memory element is the only propagation delay of the triple redundant latch.

2. The triple redundant latch as in claim 1 wherein the first settable memory element comprises:
    a) a transfer gate and;
    b) a latch.

3. The triple redundant latch as in claim 2 wherein the transfer gate consists of a complementary pass gate.

4. The triple redundant latch as in claim 2 wherein the transfer gate consists of an NFET-only pass gate.

5. The triple redundant latch as in claim 2 wherein the transfer gate consists of a PFET-only pass gate.

6. The triple redundant latch as in claim 1 wherein the second settable memory element comprises:
    a) a transfer gate and;
    b) a latch.

7. The triple redundant latch as in claim 6 wherein the transfer gate consists of a complementary pass gate.

8. The triple redundant latch as in claim 6 wherein the transfer gate consists of an NFET-only pass gate.

9. The triple redundant latch as in claim 6 wherein the transfer gate consists of a PFET-only pass gate.

10. The triple redundant latch as in claim 1 wherein the third settable memory element comprises:
    a) a transfer gate and;
    b) a latch.

11. The triple redundant latch as in claim 10 wherein the transfer gate consists of a complementary pass gate.

12. The triple redundant latch as in claim 10 wherein the transfer gate consists of an NFET-only pass gate.

13. The triple redundant latch as in claim 10 wherein the transfer gate consists of a PFET-only pass gate.

14. A triple redundant latch for reducing soft errors comprising:
 a) a first transfer gate, the first transfer gate having an input, a first control input, a second control input, and an output;
 b) a second transfer gate, the second transfer gate having an input, a first control input, a second control input, and an output;
 c) a third transfer gate, the transfer third gate having an input, a first control input, a second control input and an output;
 d) a first latch, the first latch having an input and an output;
 e) a second latch, the second latch having an input and an output;
 f) a third latch, the third latch having an input/output;
 g) a majority voter, the majority voter having a first input, a second input, a third input, fourth input, and an output;
 h) wherein the input of triple redundant latch is connected to the input of the first transfer gate, the input of the second transfer gate, and the input of the third transfer gate;
 i) wherein the output of the triple redundant latch is connected to the input/output of the third latch;
 j) wherein a first control input of the triple redundant latch is connected to the first control input of the first transfer gate, the first control input of the second transfer gate, the first control input of the third transfer gate, and the third input to the majority voter;
 k) wherein a second control input of the triple redundant latch is connected to the second control input of the first transfer gate, the second control input of the second transfer gate, the second control input of the third transfer gate, and the fourth input to the majority voter;
 l) wherein the output of the first transfer gate is connected to the input of the first latch;
 m) wherein the output of the second transfer gate is connected to the output of the majority voter, and the input/output of the third latch;
 n) wherein the output of the third transfer gate is connected to the input of the second latch;
 o) wherein the output of the first latch is connected to the first input of the majority voter;
 p) wherein the output of the second latch is connected to the second input of the majority voter.

15. The triple redundant latch as in claim 14 wherein the first transfer gate comprises:
 a) a PFET, the PFET having a gate, a drain and a source;
 b) a NFET, the NFET having a gate, a drain and a source;
 c) wherein the drains of the PFET and the NFET are connected to the input of the first transfer gate;
 d) wherein the sources of the PFET and the NFET are connected to the output of the first transfer gate;
 e) wherein the gate of the NFET is connected to the first control input of the first transfer gate;
 f) wherein the gate of the PFET is connected to the second control input of the first transfer gate.

16. The triple redundant latch as in claim 14 wherein the second transfer gate comprises:
 a) a PFET, the PFET having a gate, a drain and a source;
 b) a NFET, the NFET having a gate, a drain and a source;
 c) wherein the drains of the PFET and the NFET are connected to the input of the second transfer gate;
 d) wherein the sources of the PFET and the NFET are connected to the output of the second transfer gate;
 e) wherein the gate of the NFET is connected to the first control input of the second transfer gate;
 f) wherein the gate of the PFET is connected to the second control input of the second transfer gate.

17. The triple redundant latch as in claim 14 wherein the third transfer gate comprises:
 a) a PFET, the PFET having a gate, a drain and a source;
 b) a NFET, the NFET having a gate, a drain and a source;
 c) wherein the drains of the PFET and the NFET are connected to the input of the third transfer gate;
 d) wherein the sources of the PFET and the NFET are connected to the output of the third transfer gate;
 e) wherein the gate of the NFET is connected to the first control input of the third transfer gate;
 f) wherein the gate of the PFET is connected to the second control input of the third transfer gate.

18. The triple redundant latch as in claim 14 wherein the first latch comprises:
 a) a first PFET, the first PFET having a gate, a drain and a source;
 b) a second PFET, the second PFET having a gate, a drain and a source;
 c) a first NFET, the first NFET having a gate, a drain and a source;
 d) a second NFET, the second NFET having a gate, a drain and a source;
 e) wherein the sources of the first and second PFETs are connected to VDD;
 f) wherein the sources of the first and second NFETs are connected to GND;
 g) wherein the gate of the first NFET, the gate of the first PFET, the drain of the second NFET, and the drain of the second PFET are the input of the first latch;
 h) wherein the drain of the first NFET, the drain of the first PFET, the gate of the second NFET, and the gate of the second PFET are the output of the first latch.

19. The triple redundant latch as in claim 14 wherein the second latch comprises:
 a) a first PFET, the first PFET having a gate, a drain and a source;
 b) a second PFET, the second PFET having a gate, a drain and a source;
 c) a first NFET, the first NFET having a gate, a drain and a source;
 d) a second NFET, the second NFET having a gate, a drain and a source;
 e) wherein the sources of the first and second PFETs are connected to VDD;
 f) wherein the sources of the first and second NFETs are connected to GND;
 g) wherein the gate of the first NFET, the gate of the first PFET, the drain of the second NFET, and the drain of the second PFET are the input of the second latch;
 h) wherein the drain of the first NFET, the drain of the first PFET, the gate of the second NFET, and the gate of the second PFET are the output of the second latch.

20. The triple redundant latch as in claim 14 wherein the third latch comprises:
 a) a first PFET, the first PFET having a gate, a drain and a source;
 b) a second PFET, the second PFET having a gate, a drain and a source;
 c) a first NFET, the first NFET having a gate, a drain and a source;
 d) a second NFET, the second NFET having a gate, a drain and a source;

e) wherein the sources of the first and second PFETs are connected to VDD;

f) wherein the sources of the first and second NFETs are connected to GND;

g) wherein the gate of the first NFET, the gate of the first PFET, the drain of the second NFET, and the drain of the second PFET are the input/output of the third latch;

h) wherein the drain of the first NFET and the drain of the first PFET are connected to the gate of the second NFET, and the gate of the second PFET.

21. The triple redundant latch as in claim 14 wherein the majority voter comprises:

a) a first PFET, the first PFET having a gate, a drain and a source;

b) a second PFET, the second PFET having a gate, a drain and a source;

c) a third PFET, the third PFET having a gate, a drain and a source;

d) a first NFET, the first NFET having a gate, a drain and a source;

e) a second NFET, the second NFET having a gate, a drain and a source;

f) a third NFET, the third NFET having a gate, a drain and a source;

g) wherein the source of the first PFET is connected to VDD;

h) wherein the source of the third NFET is connected to GND;

i) wherein the drains of the third PFET and the first NFET are connected to the output of the majority voter;

j) wherein the gates of the second PFET and second NFET are connected to the first input of the majority voter;

k) wherein the gates of the first PFET and the third NFET are connected to the second input of the majority voter;

l) wherein the gate of the third PFET is connected to the third input of the majority voter;

m) wherein the gate of the first NFET is connected to the fourth input of the majority voter;

n) wherein the drain of the first PFET and the source of the second PFET are connected;

o) wherein the drain of the second PFET and the source of the third PFET are connected;

p) wherein the source of the first NFET and the drain of the second NFET are connected;

q) wherein the source of the second NFET and the drain of the third NFET are connected.

22. A method of manufacturing a triple redundant latch with improved soft error rate comprising:

a) fabricating a first transfer gate, the first transfer gate having an input, a first control input, a second control input and an output;

b) fabricating a second transfer gate, the second transfer gate having an input, a first control input, a second control input, and an output;

c) fabricating a third transfer gate, the transfer third gate having an input, a first control input, a second control input, and an output;

d) fabricating a first latch, the first latch having an input and an output;

e) fabricating a second latch, the second latch having an input and an output;

f) fabricating a third latch, the third latch having an input/output;

g) fabricating a majority voter, the majority voter having a first input, a second input, a third input, fourth input, and an output;

h) wherein the input of triple redundant latch is connected to the input of the first transfer gate, the input of the second transfer gate, and the input of the third transfer gate;

i) wherein a first control input of the triple redundant latch is connected to the first control input of the first transfer gate, the first control input of the second transfer gate, the first control input of the third transfer gate, and the third input to the majority voter;

j) wherein a second control input of the triple redundant latch is connected to the second control input of the first transfer gate, the second control input of the second transfer gate, the second control input of the third transfer gate, and the fourth input to the majority voter;

k) wherein the output of the first transfer gate is connected to the input of the first latch;

l) wherein the output of the second transfer gate is connected to the output of the majority voter, and the input/output of the third latch;

m) wherein the output of the third transfer gate is connected to the input of the second latch;

n) wherein the output of the first latch is connected to the first input of the majority voter;

o) wherein the output of the second latch is connected to the second input of the majority voter.

23. The method of manufacturing a triple redundant latch as in claim 22 wherein the first transfer gate comprises:

a) a PFET, the PFET having a gate, a drain and a source;

b) a NFET, the NFET having a gate, a drain and a source;

c) wherein the drains of the PFET and the NFET are connected to the input of the first transfer gate;

d) wherein the sources of the PFET and the NFET are connected to the output of the first transfer gate;

e) wherein the gate of the NFET is connected to the first control input of the first transfer gate;

f) wherein the gate of the PFET is connected to the second control input of the first transfer gate.

24. The method of manufacturing a triple redundant latch as in claim 22 wherein the second transfer gate comprises:

a) a PFET, the PFET having a gate, a drain and a source;

b) a NFET, the NFET having a gate, a drain and a source;

c) wherein the drains of the PFET and the NFET are connected to the input of the second transfer gate;

d) wherein the sources of the PFET and the NFET are connected to the output of the second transfer gate;

e) wherein the gate of the NFET is connected to the first control input of the second transfer gate;

f) wherein the gate of the PFET is connected to the second control input of the second transfer gate.

25. The method of manufacturing a triple redundant latch as in claim 22 wherein the third transfer gate comprises:

a) a PFET, the PFET having a gate, a drain and a source;

b) a NFET, the NFET having a gate, a drain and a source;

c) wherein the drains of the PFET and the NFET are connected to the input of the third transfer gate;

d) wherein the sources of the PFET and the NFET are connected to the output of the third transfer gate;

e) wherein the gate of the NFET is connected to the first control input of the third transfer gate;

f) wherein the gate of the PFET is connected to the second control input of the third transfer gate.

26. The method of manufacturing a triple redundant latch as in claim 22 wherein the first latch comprises:

a) a first PFET, the first PFET having a gate, a drain and a source;

b) a second PFET, the second PFET having a gate, a drain and a source;

c) a first NFET, the first NFET having a gate, a drain and a source;
d) a second NFET, the second NFET having a gate, a drain and a source;
e) wherein the sources of the first and second PFETs are connected to VDD;
f) wherein the sources of the first and second NFETs are connected to GND;
g) wherein the gate of the first NFET, the gate of the first PFET, the drain of the second NFET, and the drain of the second PFET are the input of the first latch;
h) wherein the drain of the first NFET, the drain of the first PFET, the gate of the second NFET, and the gate of the second PFET are the output of the first latch.

27. The method of manufacturing a triple redundant latch as in claim 22 wherein the second latch comprises:
a) a first PFET, the first PFET having a gate, a drain and a source;
b) a second PFET, the second PFET having a gate, a drain and a source;
c) a first NFET, the first NFET having a gate, a drain and a source;
d) a second NFET, the second NFET having a gate, a drain and a source;
e) wherein the sources of the first and second PFETs are connected to VDD;
f) wherein the sources of the first and second NFETs are connected to GND;
g) wherein the gate of the first NFET, the gate of the first PFET, the drain of the second NFET, and the drain of the second PFET are the input of the second latch;
h) wherein the drain of the first NFET, the drain of the first PFET, the gate of the second NFET, and the gate of the second PFET are the output of the second latch.

28. The method of manufacturing a triple redundant latch as in claim 22 wherein the third latch comprises:
a) a first PFET, the first PFET having a gate, a drain and a source;
b) a second PFET, the second PFET having a gate, a drain and a source;
c) a first NFET, the first NFET having a gate, a drain and a source;
d) a second NFET, the second NFET having a gate, a drain and a source;
e) wherein the sources of the first and second PFETs are connected to VDD;
f) wherein the sources of the first and second NFETs are connected to GND;
g) wherein the gate of the first NFET, the gate of the first PFET, the drain of the second NFET, and the drain of the second PFET are the input/output of the third latch;
h) wherein the drain of the first NFET and the drain of the first PFET are connected to the gate of the second NFET and the gate of the second PFET.

29. The method of manufacturing a triple redundant latch as in claim 22 wherein the majority voter comprises:
a) a first PFET, the first PFET having a gate, a drain and a source;
b) a second PFET, the second PFET having a gate, a drain and a source;
c) a third PFET, the third PFET having a gate, a drain and a source;
d) a first NFET, the first NFET having a gate, a drain and a source;
e) a second NFET, the second NFET having a gate, a drain and a source;
f) a third NFET, the third NFET having a gate, a drain and a source;
g) wherein the source of the first PFET is connected to VDD;
h) wherein the source of the third NFET is connected to GND;
i) wherein the drains of the third PFET and the first NFET are connected to the output of the majority voter;
j) wherein the gates of the second PFET and second NFET are connected to the first input of the majority voter;
k) wherein the gates of the first PFET and the third NFET are connected to the second input of the majority voter;
l) wherein the gate of the third PFET is connected to the third input of the majority voter;
m) wherein the gate of the first NFET is connected to the fourth input of the majority voter;
n) wherein the drain of the first PFET and the source of the second PFET are connected;
o) wherein the drain of the second PFET and the source of the third PFET are connected;
p) wherein the source of the first NFET and the drain of the second NFET are connected;
q) wherein the source of the second NFET and the drain of the third NFET are connected.

30. A triple redundant latch for reducing soft errors comprising:
a) a first means for setting and retaining a logical value;
b) a second means for setting and retaining a logical value;
c) a third means for setting and retaining a logical value;
d) a means for setting a logical value into the third means for setting and retaining a logical value determined by inputs provided by the first and second means for setting and retaining a logical value, and control used to set the means for setting and retaining a logical value;
e) wherein an identical logic value is set in each means for setting and retaining a logical value;
f) wherein a propagation delay through the third means for setting and retaining a logical value is the only propagation delay of the triple redundant latch.

* * * * *

UNITED STATES PATENT AND TRADEMARK OFFICE
CERTIFICATE OF CORRECTION

| | |
|---|---|
| PATENT NO. | : 7,215,581 B2 |
| APPLICATION NO. | : 10/825398 |
| DATED | : May 8, 2007 |
| INVENTOR(S) | : Jonathan P. Lotz et al. |

It is certified that error appears in the above-identified patent and that said Letters Patent is hereby corrected as shown below:

In column 6, line 39, delete "MNI1," and insert -- MN11, --, therefor.

In column 6, line 49, delete "MP1" and insert -- MP11 --, therefor.

Signed and Sealed this

Twenty-sixth Day of August, 2008

JON W. DUDAS
*Director of the United States Patent and Trademark Office*